(12) United States Patent
Park et al.

(10) Patent No.: US 9,841,621 B2
(45) Date of Patent: Dec. 12, 2017

(54) DISPLAY APPARATUS AND MANUFACTURING METHOD THEREOF

(71) Applicant: ELECTRONICS AND TELECOMMUNICATIONS RESEARCH INSTITUTE, Daejeon (KR)

(72) Inventors: Sun Tak Park, Incheon (KR); Ki Uk Kyung, Daejeon (KR); Sung Ryul Yun, Daejeon (KR); Sae Kwang Nam, Daegu (KR); Bong Je Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 93 days.

(21) Appl. No.: 14/711,266

(22) Filed: May 13, 2015

(65) Prior Publication Data

US 2016/0066445 A1 Mar. 3, 2016

(30) Foreign Application Priority Data

Aug. 26, 2014 (KR) .................. 10-2014-0111737

(51) Int. Cl.
*H05K 5/02* (2006.01)
*H05K 5/00* (2006.01)
(Continued)

(52) U.S. Cl.
CPC ........ *G02F 1/133305* (2013.01); *H01L 51/52* (2013.01); *H01L 2251/5338* (2013.01)

(58) Field of Classification Search
CPC ......... G02F 1/133305; G02F 1/133308; G02F 1/1303; G02F 1/133608; H01L 51/0097; H01L 27/3225; H01L 31/03926; G06F 1/1601; G06F 1/181; G09G 2380/02; B32B 2457/20; G09F 9/301; G09F 13/0413; H01J 31/123; F21V 7/09; H05K 5/0017; H05K 5/02; H05K 1/028; H05K 2201/05;
(Continued)

(56) References Cited

U.S. PATENT DOCUMENTS 5,273,475 A * 12/1993 Oshikawa ......... G02F 1/133305
156/163
8,206,536 B2 6/2012 Kim et al.
(Continued)

FOREIGN PATENT DOCUMENTS

KR 10-2005-0085066 A 8/2005
KR 2013-0113784 A 10/2013
(Continued)

*Primary Examiner* — James Wu
*Assistant Examiner* — Michael Matey
(74) *Attorney, Agent, or Firm* — Rabin & Berdo, P.C.

(57) ABSTRACT

Provided herein a display apparatus including a display panel including a first surface for displaying information and a second surface disposed opposite to the first surface, and where a curvature is formed as a physical force is applied; and a curvature changing unit bonded to at least a portion of the second surface, wherein the curvature changing unit includes a first actuator unit configured to curve the display panel when a voltage is applied and a fixing unit configured to fixate the first actuator unit.

13 Claims, 7 Drawing Sheets

(51) Int. Cl.
*G02F 1/1333* (2006.01)
*H01L 51/52* (2006.01)

(58) Field of Classification Search
CPC ... H05K 2201/056; H05K 2201/10128; H05K 5/0217; H04M 1/0268
See application file for complete search history.

(56) References Cited

U.S. PATENT DOCUMENTS

| | | | | |
|---|---|---|---|---|
| 2006/0098153 | A1* | 5/2006 | Slikkerveer | G02F 1/133305 349/187 |
| 2009/0038749 | A1* | 2/2009 | Kim | B32B 7/12 156/247 |
| 2010/0156845 | A1* | 6/2010 | Kim | G06F 3/03547 345/174 |
| 2012/0168009 | A1* | 7/2012 | Chen | G09F 9/301 137/560 |
| 2012/0312585 | A1* | 12/2012 | Baek | H01B 1/04 174/254 |
| 2013/0207793 | A1* | 8/2013 | Weaber | G06F 1/1601 340/407.2 |
| 2013/0265631 | A1* | 10/2013 | Ahn | G09F 9/372 359/295 |
| 2013/0286462 | A1* | 10/2013 | Yeo | G09G 5/00 359/291 |
| 2014/0003006 | A1 | 1/2014 | Ahn | |
| 2014/0015402 | A1 | 1/2014 | Ahn et al. | |
| 2014/0015777 | A1* | 1/2014 | Park | G06F 3/044 345/173 |
| 2014/0045283 | A1* | 2/2014 | Hirakata | H01L 51/56 438/22 |
| 2014/0202014 | A1* | 7/2014 | Choi | G01B 21/22 33/303 |
| 2015/0145824 | A1* | 5/2015 | Park | G06F 3/044 345/174 |
| 2016/0187985 | A1* | 6/2016 | Lim | G06F 3/016 345/173 |
| 2016/0195742 | A1* | 7/2016 | Kim | G02F 1/133788 349/33 |

FOREIGN PATENT DOCUMENTS

| | | |
|---|---|---|
| KR | 2014-0002243 A | 1/2014 |
| KR | 2014-0007689 A | 1/2014 |
| KR | 2014-0049911 A | 4/2014 |
| WO | WO 2004-049050 A1 | 6/2004 |

\* cited by examiner

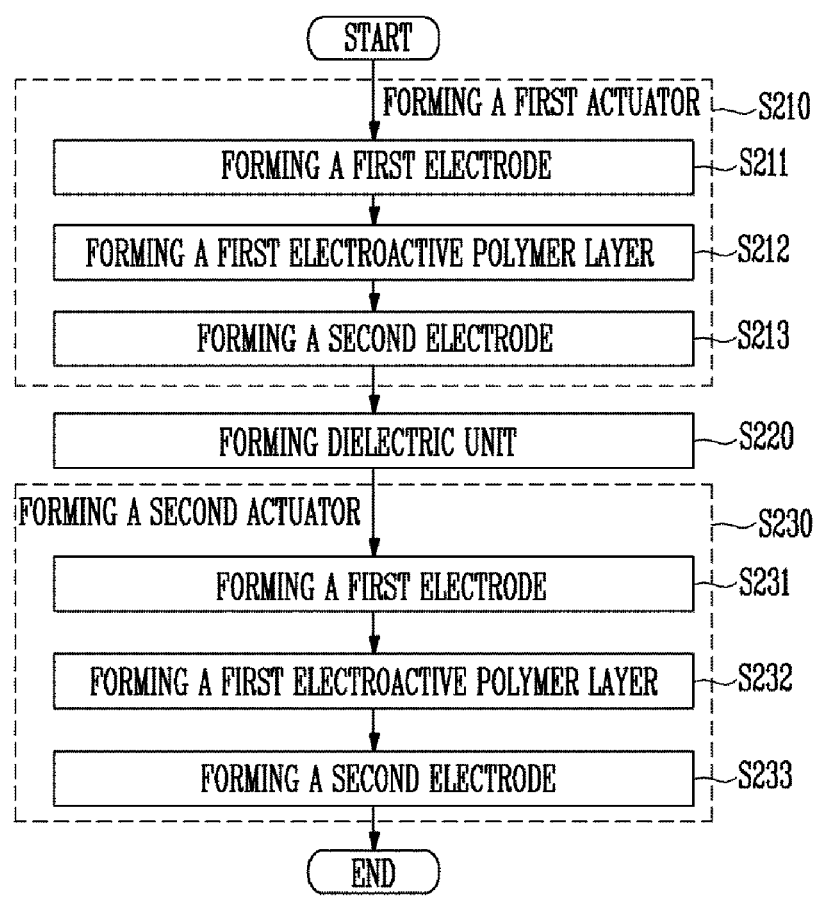

DISPLAY APPARATUS AND MANUFACTURING METHOD THEREOF

CROSS-REFERENCE TO RELATED APPLICATION

The present application claims priority to Korean patent application number 10-2014-0111737, filed on Aug. 26, 2014, the entire disclosure of which is incorporated herein in its entirety by reference.

BACKGROUND

Field of Invention

Various embodiments of the present disclosure relate to a display apparatus and a manufacturing method thereof, and more particularly, to a display apparatus of which the curvature may be changed if necessary by a user and of which the changed condition may be maintained, and a manufacturing method thereof.

Description of Related Art

As display technologies develop to cathode ray tubes, displays, liquid displays, and organic light-emitting displays and so forth, the performance, size, and function of displays are diversifying. Especially, due to the recent market demand for flexible displays that may be bent or curved, proactive research and development is underway on such technologies.

One of the conventional technologies for realizing a bendable display is a technology of manufacturing a flexible display by disposing a liquid crystal cell between two pre-molded curved type substrates. However, such a technology not only costs a lot to maintain a constant cell gap between two pre-molded substrates, but it also has a very low yield rate, and such a technology is difficult to implement in reality. Furthermore, another disadvantage is that in order to provide different curvatures of the display apparatus, a separate molding tool must be manufactured for each product, increasing the manufacturing cost. Another method presented for manufacturing a display panel was to apply a tensile force to a film and then to bond the film to the display panel in order to eliminate the tensile force. However, in this method, it is difficult to adjust the curvature after eliminating the tensile force, which makes it very difficult to manufacture a display panel having a desirable curvature.

In order to resolve these disadvantages, a method was presented to manufacture a flexible display panel, and then to apply a physical force to the display panel to bend the display panel. Another method is to bond a display panel to a curving driving film that may be curved by a current flow, and then to apply power to the curving driving film to curve the display panel. However, although such a technology may curve the display panel to have a desired curvature, it has a disadvantage that it has to consume power continuously to maintain that curvature.

SUMMARY

A first purpose of the present disclosure is to resolve the aforementioned problems, that is, to provide a display apparatus of which a curvature may be adjusted by applying power, and of which the curvature may be maintained without having to apply power continuously, and a manufacturing method thereof.

An embodiment of the present disclosure provides a display apparatus including a display panel including a first surface for displaying information and a second surface disposed opposite to the first surface, and where a curvature is formed as physical force is applied; and a curvature changing unit bonded to at least a portion of the second surface, wherein the curvature changing unit includes a first actuator unit configured to curve the display panel when a voltage is applied and a fixing unit configured to fixate the first actuator unit.

Another embodiment of the present disclosure provides a method for manufacturing a display apparatus, the method including preparing a display panel for displaying information; forming an actuator unit configured to curve the display panel by applying a physical force to the display panel when a voltage is applied; and forming a fixing unit configured to selectively fixate the actuator unit.

The present disclosure has an effect of providing a display apparatus wherein its curvature may be adjusted, and then the curvature may be maintained without having to apply power continuously, and a manufacturing method thereof.

Furthermore, the present disclosure has an effect of providing a display apparatus which uses a polymer layer that changes its state according to temperature so that the polymer layer may be heated to have ductility when adjusting the curvature of the display apparatus, and then once the display apparatus is curved to a desired curvature, the polymer layer may be cooled down so that the curvature is maintained even when power is not applied continuously, and a manufacturing method thereof.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 7 is a view for explaining a step of forming an actuator unit of a method for manufacturing a display apparatus according to another embodiment of the present disclosure.

DETAILED DESCRIPTION

Figure 1A:
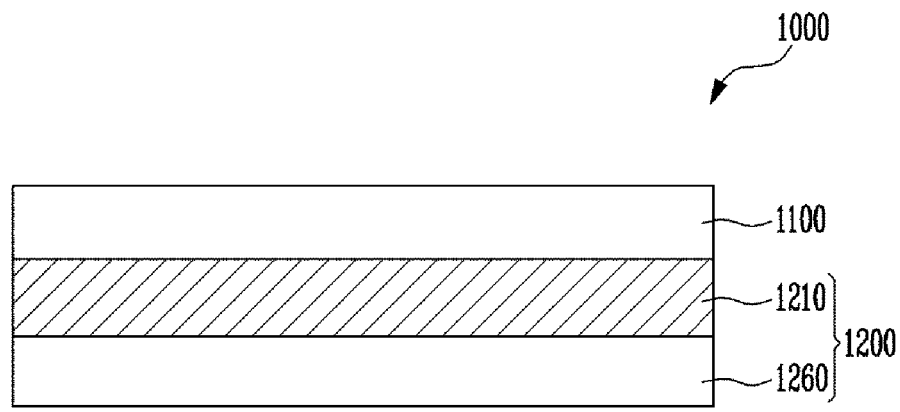
FIGS. 1A and 1B are views for explaining a display apparatus according to an embodiment of the present disclosure.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Figure 1B:
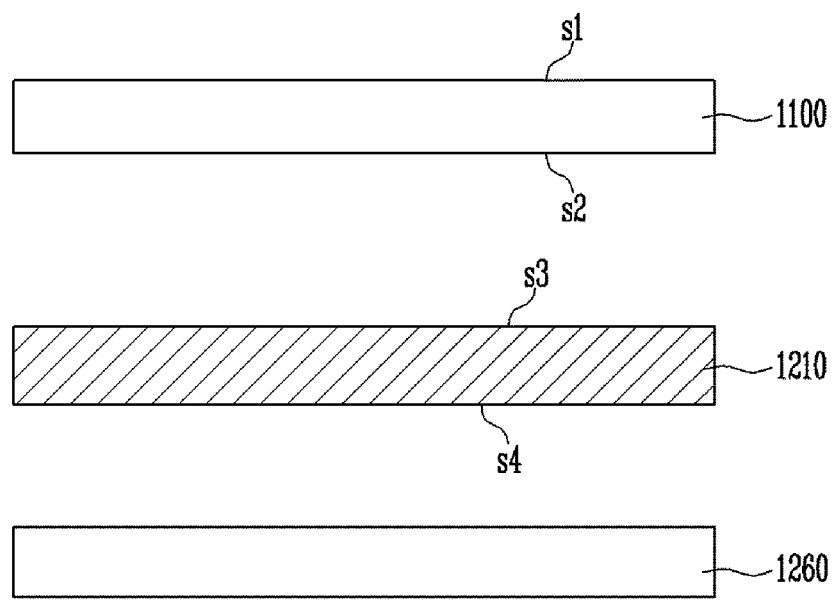

FIGS. 1A and 1B are views for explaining a display apparatus according to an embodiment of the present disclosure. Referring to FIGS. 1A and 1B, a display apparatus 1000 according to the present disclosure includes a display panel 1100 and a curvature changing unit 1200, and the curvature changing unit 1200 includes a first actuator unit 1210 and a fixing unit 1260.

The display panel 1100 includes a first surface s1 for displaying information and a second surface s2 facing the first surface s1, and when a physical force is applied, a curvature is formed. The display panel 1100 may be an organic light emitting diode (OLED), liquid crystal display (LCD), or E-paper and so forth, and a substance of a substrate that becomes a basis for the display panel 1100 may be deformable polymer, glass, or the like. If the first actuator unit 1210 and fixing unit 1260 are both transparent, the second surface s2 may display information as well.

Of the curvature changing unit 1200, the first actuator unit 1210 includes a third surface s3 and fourth surface s4, and when a voltage (energy) is applied, the display panel 1100 may be curved. When a voltage is applied to the first actuator unit 1210, the first actuator unit 1210 expands while the display panel 1100 does not expand, and thus due to a difference of tensile force between the display panel 1100 and the curvature changing unit 1210, the display panel 1100 may be curved. Detailed configuration of the first actuator unit 1210 will be explained in further detail hereinafter.

Of the curvature changing unit 1200, the fixing unit 1260 selectively fixates the first actuator unit 1210. The fixing unit 1260 may include a polymer layer that is fixated (where the shape is barely changed by external force) at room temperature but that is not fixated (where the shape may be changed by external force without resistance) at or above a certain temperature. With the fixing unit 1260 not physically fixated due to a temperature change, the first actuator unit 1210 may form a curvature of the display panel 1100, and then physically fixate the fixing unit 1260 by changing the temperature back to the original temperature. If the fixing unit 1260 is physically fixated after the display panel 1100 forms a curvature, that curvature may be maintained even if a voltage is not applied to the first actuator unit 1210. Configuration of the fixing unit 1260 will be explained in further detail hereinafter. FIGS. 1A and 1B illustrate that the third surface s3 is bonded to the second surface s2 of the display panel 1100, and the fourth surface s4 is bonded to the fixing unit 1260, but alternatively, the display panel 1100 and the fixing unit 1260 may be bonded to each other and the fixing unit 1260 and the first actuator unit 1210 may be bonded to each other.

The display apparatus 1000 according to the present disclosure may be manufactured in various methods. For example, the first actuator unit 1210 may be formed directly on top of the display panel 1100, and the fixing unit 1260 may be formed directly on top of the first actuator unit 1210. In such a case, a buffer layer (not illustrated) configured to facilitate adhesion of layers may be formed between the layers. Otherwise, the display panel 1100, first actuator unit 1210 and fixing unit 1260 may be separately provided or manufactured, and then be bonded. In such a case, a bonding unit (not illustrated) for bonding the display panel 1100, first actuator unit 1210 and fixing unit 1260 may be formed.

Figure 2A:
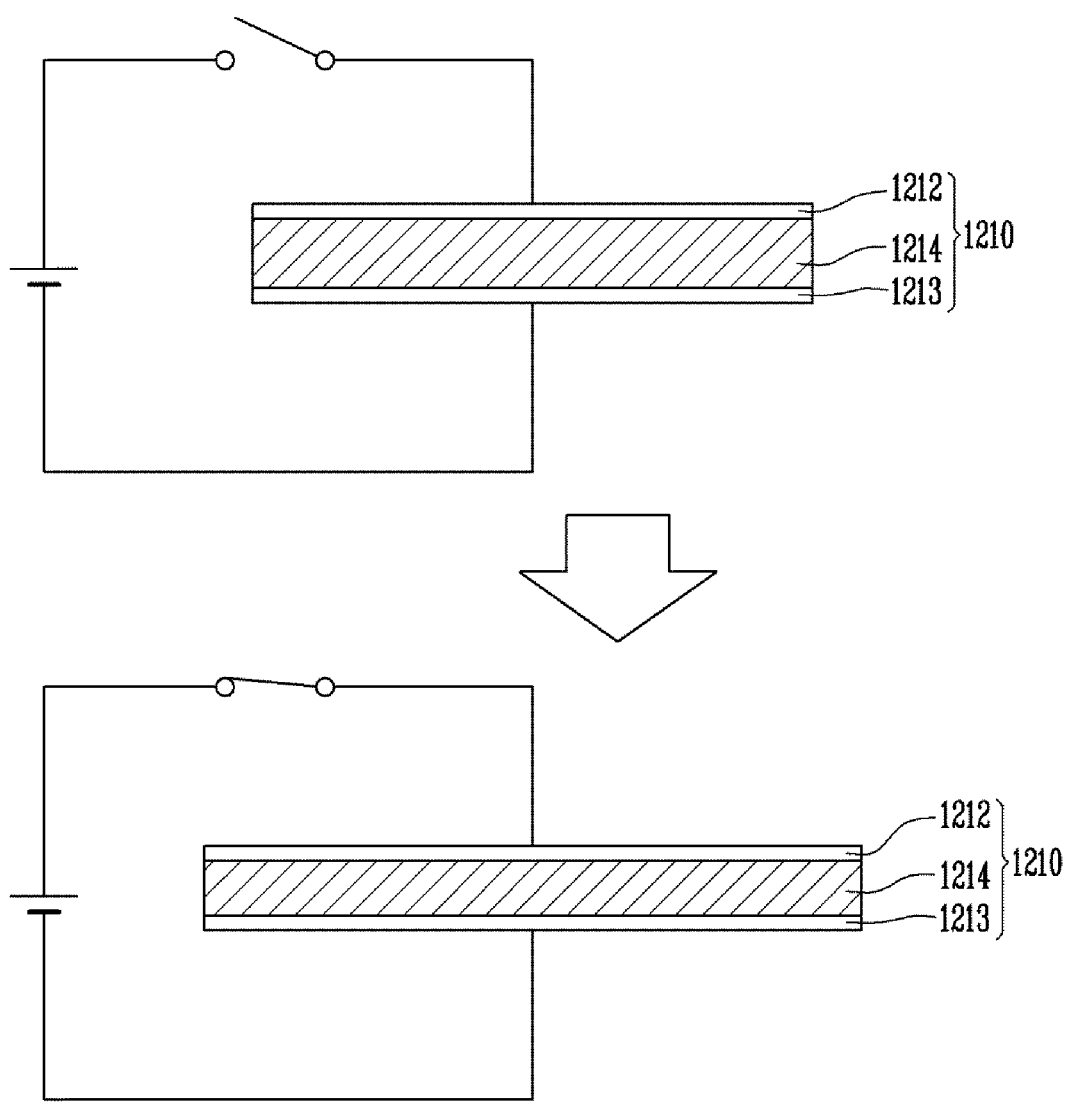
FIGS. 2A to 2C are views for explaining a curvature changing unit in a display apparatus according to an embodiment of the present disclosure.
Figure 2B:
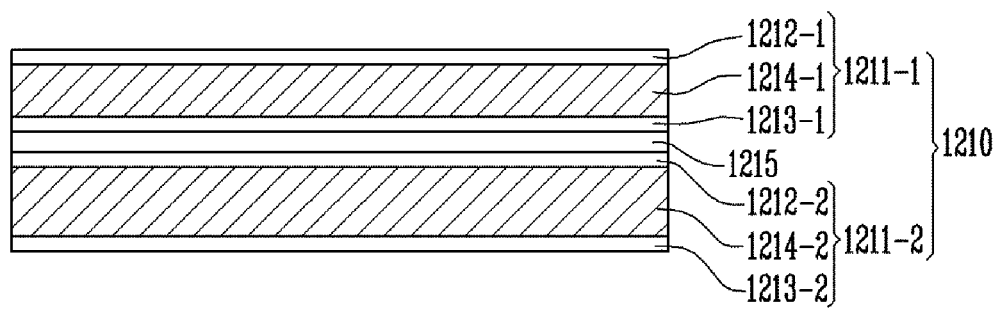
Figure 2C:
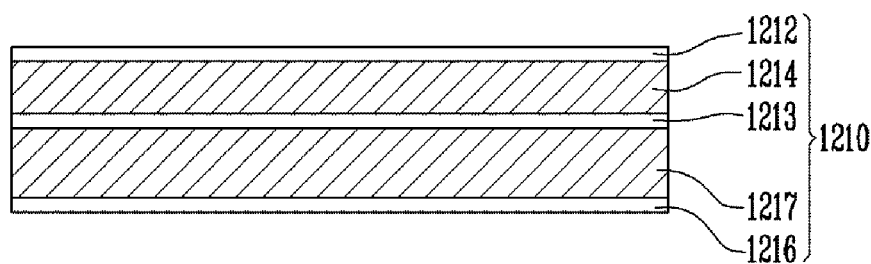

FIGS. 2A to 2C are views for explaining a curvature changing unit of a display apparatus according to an embodiment of the present disclosure.

Referring to FIG. 2A, the first actuator unit 1210 includes a first electrode 1212, second electrode 1213, and first electroactive polymer layer 1214.

The top view of FIG. 2A illustrates a case where power is not applied to the first actuator unit 1210, while the bottom view of FIG. 2A illustrates a case where power is applied to the first actuator unit 1210. In the bottom view of FIG. 2A, to the first electrode 1212 a first voltage is applied, and to the second electrode 1213 a second voltage that is different from the first voltage is applied. The substance of the first electrode 1212 and the second electrode 1213 may desirably be at least one selected from carbon nanotube (CNT), metal nanowire, graphene, conductive polymer, ITO (indium-tin-oxide), TCO (Transparent Conductive Oxide) and metal.

When different voltages are applied to the first electrode 1212 and the second electrode 1213, the first electroactive polymer layer 1214 expands, and when bonded to the display panel 1100, a degree of expansion of the first electroactive polymer layer 1214 differs from a degree of expansion of the display panel 1100, and thus the display panel 1100 is curved. When comparing the top view and bottom view of FIG. 2A, a substance of the first electroactive polymer layer 1214 may desirably be selected from an ionic electroactive polymer, dielectric actuator, relaxor ferroelectric polymer, liquid crystal rubber, PVDF (PolyVinyliDene Fluoride), PDMS (PolyDiMethyl Siloxane) and PVFT (PolyVinylidene Fluoride-co-Trifluoroethylene). Referring to FIGS. 1A and 1B again, when the first electrode 1212, second electrode 1213, first electroactive polymer layer 1214 and fixing unit 1260 are made of transparent substance, the display apparatus 1000 may be used as a transparent display.

FIG. 2B is a view for explaining a structure of the first actuator unit 1210 that includes a plurality of actuators 1211-1, 1211-2. Referring to FIG. 2B, the first actuator unit 1210 includes the first actuator 1211-1, second actuator 1211-2, and a dielectric unit 1215 that blocks electrical connection between the first actuator 1211-1 and the second actuator 1211-2. The first actuator 1211-1 includes a first electrode 1212-1, second electrode 1213-1, and first electroactive polymer layer 1214-1, while the second actuator 1211-2 includes a first electrode 1212-2, second electrode 1213-2, and first electroactive polymer layer 1214-2. When a first voltage is applied to the first electrodes 1212-1, 1212-2, and a second voltage that is different from the first voltage is applied to the second electrodes 1213-1, 1213-2, since two actuators are driven by the first voltage and the second voltage, the force that forms a curvature increases compared to when driving one actuator.

FIG. 2C is a view for explaining a structure of a first actuator unit 1210 that includes a plurality of electroactive polymer layers 1214, 1217. Referring to FIG. 2C, the first actuator unit 1210 not only includes a first electrode 1212, second electrode 1213, and first electroactive polymer layer 1214, but also a third electrode 1216 and second electroactive polymer layer 1217. To the third electrode 1216, a third voltage that is different from the second voltage is applied, and the second electroactive polymer layer 1217 expands when different voltages are applied to the second voltage 1213 and the third electrode 1216. The third voltage may be different from the first voltage, or the same as the first voltage. When the plurality of electroactive polymer layers 1214, 1217 expand, the force forming a curvature increases compared to when driving one electroactive polymer layer.

Figure 3:
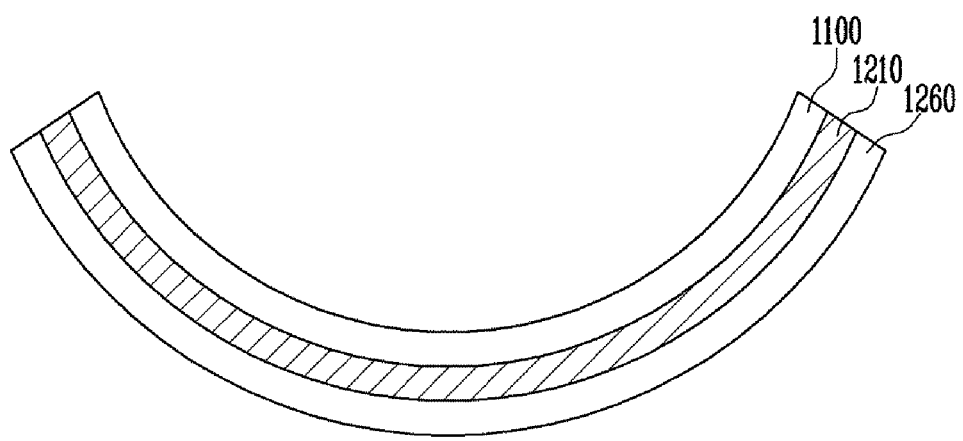
FIG. 3 is a view for explaining a state where a display apparatus is curved according to an embodiment of the present disclosure.

FIG. 3 is a view for explaining a state where a display apparatus is curved according to an embodiment of the present disclosure. Referring to FIG. 2A, FIG. 2B, and FIG. 3, with a temperature of the fixing unit 1260 increased, and the fixing unit 1260 not physically fixated due to the increased temperature, the first voltage and second voltage are applied to the first actuator 1210. By the first actuator unit 1210, when a physical force (expanding force) is applied, the display panel 1100 where a curvature is formed and the fixing unit 1260 that is not fixated are curved together. Then, when the temperature is changed back to the original temperature (for example, to room temperature), the fixing unit 1260 is physically fixated. Therefore, even when the voltage that used to be applied to the first actuator 1210 is blocked, the curved state is maintained.

Figure 4:
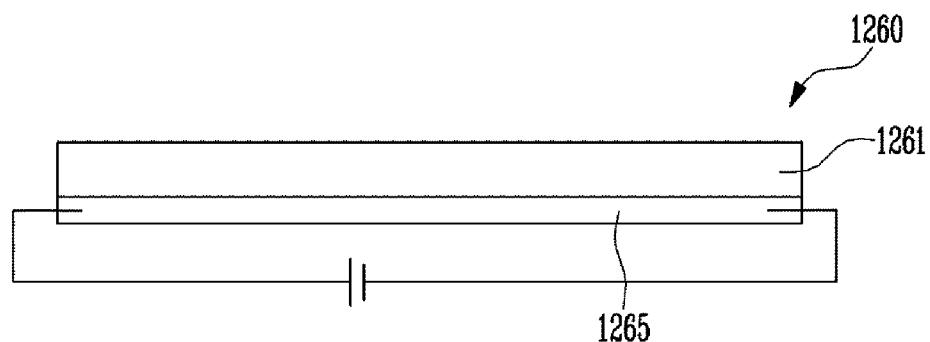
FIG. 4 is a view for explaining a fixing unit in a display apparatus according to an embodiment of the present disclosure.

FIG. 4 is a view for explaining a fixing unit of a display apparatus according to an embodiment of the present disclosure. The fixing unit 1260 includes a polymer layer 1261 of which a phase changes according to temperature and a heating unit 1265 that heats the polymer layer 1261.

The polymer layer 1261 is fixated at room temperature, but when placed at a certain temperature or above, the polymer layer 1261 is not fixated (easily expandable by external force), and a substance of the polymer layer 1261 may desirably be at least one selected from a phase transition polymer or shape memory polymer.

The heating unit 1265 heats the polymer 1261 entirely or selectively, and may desirably include a hot wire to which power may be applied at both ends of the heating unit 1265. When a voltage is applied to both ends of the hot wires, as current flows, the hot wires generate heat, thereby heating the polymer layer 1261. To facilitate the heating, a plurality of hot wires may be used, or hot wires may be formed to have zigzag shapes.

Figure 5A:
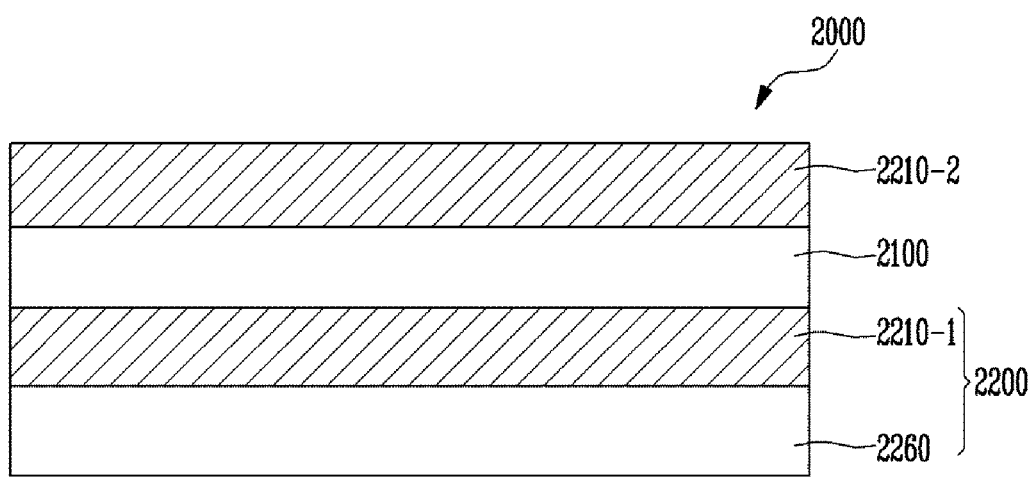
FIGS. 5A to 5C are views for explaining a display apparatus according to another embodiment of the present disclosure.
Figure 5B:
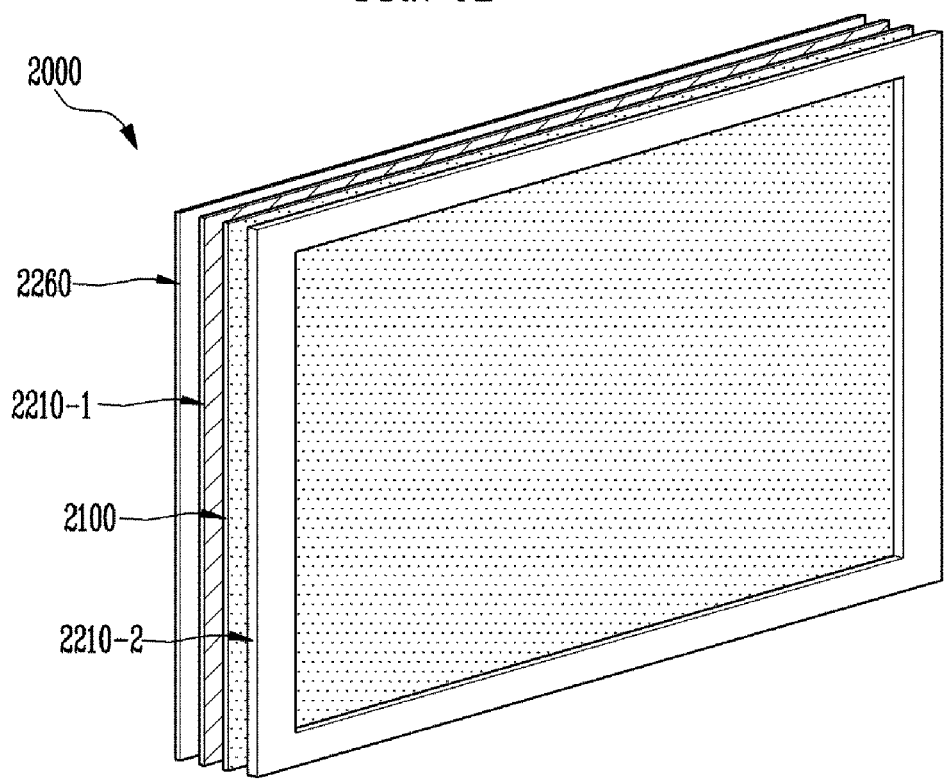
Figure 5C:
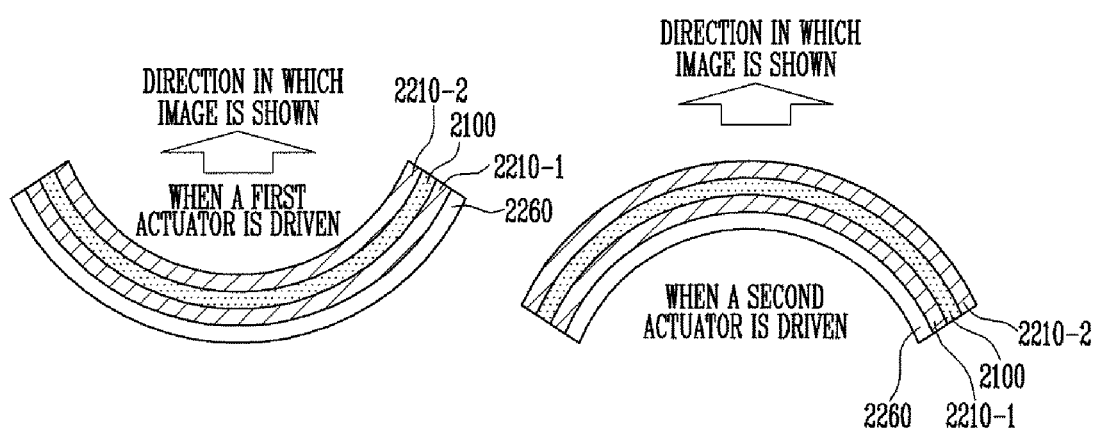

FIGS. 5A to 5C are views for explaining a display apparatus according to another embodiment of the present disclosure.

FIG. 5A is a cross-sectional view for explaining the display apparatus according to the another embodiment of the present disclosure. Referring to FIG. 5A, the display apparatus 2000 includes a display panel 2100, a curvature changing unit 2200 that includes a first actuator 2210-1 and a fixing unit 2260, and a second actuator 2210-2.

The display panel 2100, first actuator unit 2210-1 and fixing unit 2260 are very similar to the display panel 1100, first actuator unit 1210 and fixing unit 1260 illustrated in FIG. 1A, and thus detailed explanation may be omitted. The second actuator unit 2210-2 is bonded to at least a portion of a surface that is opposite to a surface bonded to the first actuator unit 2210-1. As explained with reference to FIGS. 1A and 1B, the first actuator unit 2210-1, second actuator unit 2210-2, and fixing unit 2260 may be formed on top of the display panel 2100, or formed separately. The second actuator 2210-2 may include a first electrode, second electrode, and electroactive polymer layer as illustrated in FIG. 2A or FIG. 2B.

FIG. 5B is a view for explaining an area where the second actuator unit 2210-2 is formed on the display panel 2100. When the second actuator unit 2210-2 is formed on top of a surface that provides information of the display panel 2100, the second actuator unit 2210-2 may be formed only on a portion where the information is not displayed (for example, bezel and so forth) of the display panel 2100. Otherwise, the second actuator unit 2210-2 may be configured to have transparency so that it may obtain information from the display panel 2100 even when it is formed on the portion where the information is displayed.

FIG. 5C is a view for explaining a state where the display apparatus according to the another embodiment of the present disclosure is curved. When the first actuator unit 2210-1 is driven, the central portion of the display apparatus 2000 may be curved such that it looks caved in in the viewpoint of a viewer as illustrated in the left view of FIG. 5C. On the contrary, when the second actuator unit 2210-2 is driven, the central portion of the display apparatus 2000 may be curved such that it looks bulging out in the viewpoint of the viewer as illustrated in the right view of FIG. 5C.

Figure 6:
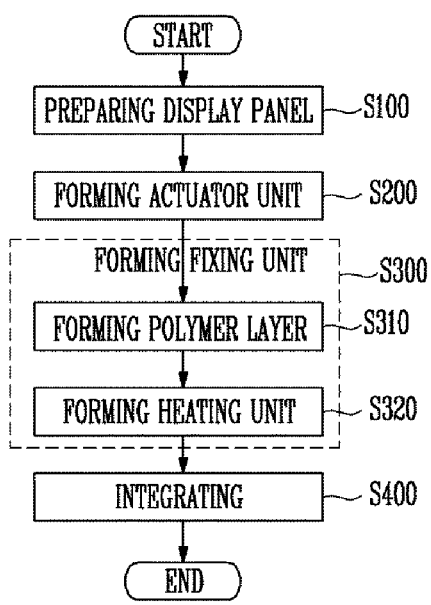
FIG. 6 is a view for explaining a method for manufacturing a display apparatus according to another embodiment of the present disclosure.

FIG. 6 is a view for explaining a method for manufacturing a display apparatus according to another embodiment of the present disclosure. Referring to FIG. 6, the method for manufacturing a display apparatus according to the another embodiment of the present disclosure may include preparing a display panel (S100), forming an actuator unit (S200), forming a fixing unit (S300), and integrating (S400). Hereinafter, explanation will be made with reference to FIG. 1A, FIG. 1B, FIG. 2A, FIG. 2B, and FIG. 4.

At the step of preparing a display panel (S100), a display panel 1100 may be manufactured, or may be provided externally. The method of manufacturing a display panel is the same as the method for manufacturing a general OLED or LCD, and thus explanation may be omitted.

At the step of forming an actuator (S200), a first actuator unit 1210 is formed. It may be formed on top of a second surface s2 of the display panel 1100, or may be formed separately. A first electrode 1212 may be formed followed by a first electroactive polymer layer 1214 followed by a second electrode 1213, or in an opposite order. The case where the first actuator unit 1210 includes the first actuator 1211-1, second actuator 1211-2, and dielectric layer 1215 will be explained in detail with reference to FIG. 7.

At the step of forming a fixing unit (S300), a step of forming a polymer layer (S310) and a step of forming a heating unit (S320) are performed. At the step of forming a polymer layer (S310), a polymer layer 1261 is formed. As mentioned earlier on, the polymer layer 1261 may be deposited on top of the display panel 1100 or the first actuator unit 1210, or may be formed separately. At the step of forming a heating unit (S320), a heating unit 1265 is formed on top of the polymer layer 1261. The heating unit 1265 includes a hot wire to which power may be applied on both ends of the heating unit 1265, or may include a plurality of zigzag hot wires to deliver heat evenly.

At the step of integrating (S400), the display panel 1100, first actuator unit 1210, and fixing unit 1260 are integrated. The step of integrating (S400) is performed when at least one of the display panel 1100, first actuator unit 1210 and fixing unit 1260 is separately formed. The integration may be performed by general attaching or bonding and the like.

FIG. 7 is a view for explaining a step of forming an actuator unit of a method for manufacturing a display apparatus according to another embodiment of the present disclosure. Referring to FIG. 7, when the first actuator unit 1210 includes a first actuator 1211-1, second actuator 1211-2, and dielectric layer 1215, the step of forming an actuator unit (S200) includes a step of forming the first actuator unit (S210), a step of forming the dielectric unit (S220), and a step of forming the second actuator (S230). Hereinafter, explanation will be made with reference to FIG. 1A, FIG. 1B, FIG. 2A, FIG. 2B, and FIG. 4 again.

At the step of forming a first actuator (S210), a step of forming a first electrode (S211), a step of forming a first electroactive polymer layer (S212), and a step of forming a second electrode (S213) are performed. At the step of forming the first electrode (S211), the first electrode 1212-1 is formed, at the step of forming the first electroactive polymer layer (S212), the first electroactive polymer layer 1214-1 is formed, and at the step of forming the second electrode (S213), the second electrode 1213-1 is formed.

After the step of forming a first actuator (S210), a step of forming a dielectric unit (S220) is performed. The dielectric unit 1215 blocks electrical connection between the first actuator 1211-1 and the second actuator 1211-2.

After the step of forming a dielectric unit (S220), a step of forming a second actuator (S230) is performed. At the step of forming a second actuator (S230), a step of forming a first electrode (S231), a step of forming a first electroactive polymer layer (S232), and a step of forming a second electrode (S233) are performed. At the step of forming a first electrode (S231), the first electrode 1212-2 is formed, at the step of forming a first electroactive polymer layer (S232), a first electroactive polymer layer 1214-2 is formed, and at the step of forming a second electrode (S233), a second electrode 1213-2 is formed.

At the step of forming a first actuator (S210) and the step of forming a second actuator (S230), the step of forming a first electrode (S211, S231) was performed before the step of forming a second electrode (S213, S233), but this is just an embodiment, and thus the first actuator 1211-1 and the second actuator 1211-2 may each be formed through the step of forming the second electrode, followed by the step of forming the first electroactive polymer layer, followed by the step of forming the first electrode.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus comprising:
   a display panel comprising
      a first surface for displaying information, and
      a second surface opposite to the first surface,
   the display panel being curvable as physical force is applied thereto; and
   a curvature changing unit including
      a first actuator unit having a first surface and a second surface opposite to each other, the first surface thereof being in contact with the second surface of the display panel, and
      a fixing unit including a polymer layer of which a surface is in contact with the second surface of the first actuator unit the polymer layer being fixated when a temperature thereof is below a threshold, and is not fixated when the temperature thereof is at or above the threshold,
   the first actuator unit being configured to curve the display panel when a voltage is applied thereto and when the temperature of the fixing unit is at or above the threshold.

2. The apparatus according to claim 1,
   further comprising a second actuator unit bonded to at least a portion of the first surface of the display panel.

3. The apparatus according to claim 1, wherein the first actuator unit comprises:
   a first electrode to which a first voltage is applied;
   a second electrode to which a second voltage that is different from the first voltage is applied; and
   a first electroactive polymer layer disposed between the first electrode and the second electrode, and configured to generate the physical force when the first voltage and the second voltage are applied.

4. The apparatus according to claim 3,
   wherein a substance of the electroactive polymer layer is at least one selected from ionic electroactive polymer, dielectric actuator, relaxor ferroelectric polymer, liquid crystal rubber, PVDF (PolyVinyliDene Fluoride), PDMS (PolyDiMethyl Siloxane) and PVFT (PolyVinylidene Fluoride-co-Trifluoroethylene).

5. The apparatus according to claim 3,
   wherein a substance of the first electrode and the second electrode is at least one selected from carbon nanotube (CNT), metal nanowire, graphene, conductive polymer, ITO (indium-tin-oxide), TCO (Transparent Conductive Oxide) and metal.

6. The apparatus according to claim 1,
   wherein the first actuator unit comprises:
   a first actuator configured to curve the display panel when a voltage is applied;

a second actuator configured to perform a same function as the first actuator; and a dielectric unit configured to block electrical connection between the first actuator and the second actuator.

7. The apparatus according to claim 3, wherein the first actuator unit further comprises:

a third electrode to which one of the second voltage and a third voltage that is different from the second voltage is applied; and a second electroactive polymer layer disposed between the second electrode and the third electrode, and configured to generate the physical force when the second voltage and the third voltage are applied.

8. The apparatus according to claim 1, wherein the fixing unit further comprises a heating unit configured to heat the polymer layer.

9. The apparatus according to claim 8, wherein a substance of the polymer layer is at least one selected from a phase transition polymer and a shape memory polymer.

10. The apparatus according to claim 8, wherein the heating unit comprises a hot wire to which power is applied at both ends of the hot wire.

11. A method for manufacturing a display apparatus, the method comprising:

preparing a display panel for displaying information, the display panel having a first surface and a second surface opposite to each other;

forming an actuator unit configured to curve the display panel by applying a physical force to the display panel when a voltage is applied, the actuator unit having a first surface and a second surface opposite to each other, the first surface thereof being in contact with the second surface of the display panel; and forming a fixing unit configured to selectively fixate the actuator unit, including forming a polymer layer of which a surface is in contact with the second surface of the actuator unit, the polymer layer being fixated when a temperature thereof is below a threshold, and is not fixated when the temperature thereof is at or above the threshold, the actuator unit being configured to curve the display panel when a voltage is applied thereto and when the temperature of the fixing unit is at or above the threshold.

12. The method according to claim 11, wherein the forming a fixing unit further comprises forming a hot wire configured to heat the polymer layer on top of the polymer layer.

13. The method according to claim 11, wherein at least one of the actuator unit and the fixing unit is formed separately from the display panel, and the method further comprises, after forming the fixing unit, a step of integrating the display panel, the actuator unit and the fixing unit.

* * * * *